United States Patent
Xu et al.

(10) Patent No.: US 9,799,610 B2
(45) Date of Patent: Oct. 24, 2017

(54) PLURALITY OF STIFFENERS WITH THICKNESS VARIATION

(71) Applicant: INTEL CORPORATION, Santa Clara, CA (US)

(72) Inventors: Mingjie Xu, Chandler, AZ (US); Suzana Prstic, Chandler, AZ (US); Kedar Dhane, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/975,360

(22) Filed: Dec. 18, 2015

(65) Prior Publication Data

US 2017/0179043 A1 Jun. 22, 2017

(51) Int. Cl.
 *H01L 23/04* (2006.01)
 *H01L 23/00* (2006.01)
 *H01L 23/16* (2006.01)

(52) U.S. Cl.
 CPC ............ *H01L 23/562* (2013.01); *H01L 23/16* (2013.01)

(58) Field of Classification Search
 CPC .............................. H01L 23/16; H01L 23/562
 See application file for complete search history.

(56) References Cited

U.S. PATENT DOCUMENTS

| | | | |
|---|---|---|---|
| 5,889,321 A | 3/1999 | Culnane et al. | |
| 5,940,271 A * | 8/1999 | Mertol ................ | H01L 23/4093 165/185 |
| 7,259,448 B2 * | 8/2007 | Zhang ..................... | H01L 23/13 257/678 |
| 8,986,806 B1 * | 3/2015 | Baloglu ................ | H01L 23/562 257/433 |
| 2007/0172992 A1 * | 7/2007 | Grigg .................. | G03F 7/70416 438/125 |
| 2007/0278647 A1 * | 12/2007 | Morita ..................... | H01L 23/16 257/686 |
| 2008/0001308 A1 * | 1/2008 | Chen ....................... | H01L 23/16 257/778 |
| 2010/0155927 A1 | 6/2010 | Cheah et al. | |
| 2011/0018125 A1 * | 1/2011 | Loo ......................... | H01L 23/16 257/706 |
| 2014/0061893 A1 | 3/2014 | Saeidi et al. | |

FOREIGN PATENT DOCUMENTS

KR 1020040027332 A 4/2004

OTHER PUBLICATIONS

PCT/US2016/059180, International Search Report and Written Opinion, dated Jan. 31, 2017, 14 pages.

* cited by examiner

*Primary Examiner* — Alonzo Chambliss
(74) *Attorney, Agent, or Firm* — Stoel Rives LLP

(57) ABSTRACT

Creating surface variations on a stiffener in a stack reduces inter-stiffener sticking and stiffener stack tilt in pick and place media. The surface variations provide one or more airgaps that reduce inter-stiffener surface contact, provide space for contaminants and/or provide an averaged surface height due to surface roughness.

22 Claims, 9 Drawing Sheets

PLURALITY OF STIFFENERS WITH THICKNESS VARIATION

TECHNICAL FIELD

This invention relates generally to packaging of integrated circuits. More specifically, this invention relates to a stiffener for a package substrate.

DETAILED DESCRIPTION OF PREFERRED EMBODIMENTS

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Techniques, apparatus and methods are disclosed that reduce inter-stiffener sticking and stiffener stack tilt in pick and place media by creating surface variations on each stiffener. The surface variations provide one or more airgaps that reduce inter-stiffener surface contact, provide space for contaminants and/or provide an averaged surface height due to surface roughness.

For example, a stiffener is very thin, picture-frame-shaped stainless steel component that comes stacked in a cointube for shipping media and use as pick and place media. Stiffeners are used in industry as warpage control for a substrate upon which a die (semiconductor, processor, etc.) can be placed. A cointube as handling media can have an advantage in lower cost as compared with other industry choices of tape and reels or Jedec trays.

However, smooth stiffeners can have problems when stacked (e.g., when used with cointube media). Stiffeners can stick to each other due to minute factory contamination sandwiched between them. Stiffeners at a top of the stack can be tilted due to raw material thickness variation. Small thickness variations can be aggregated by stacking to form a larger tilt at the top of the stack. Both sticking and tilt create a pick and place tool assist condition, which can slow production. This problem can be compounded by thinness and weight. For example, a stiffener can be about 300 um in height (as measured in the direction of a stack in a cointube).

Figure 1:
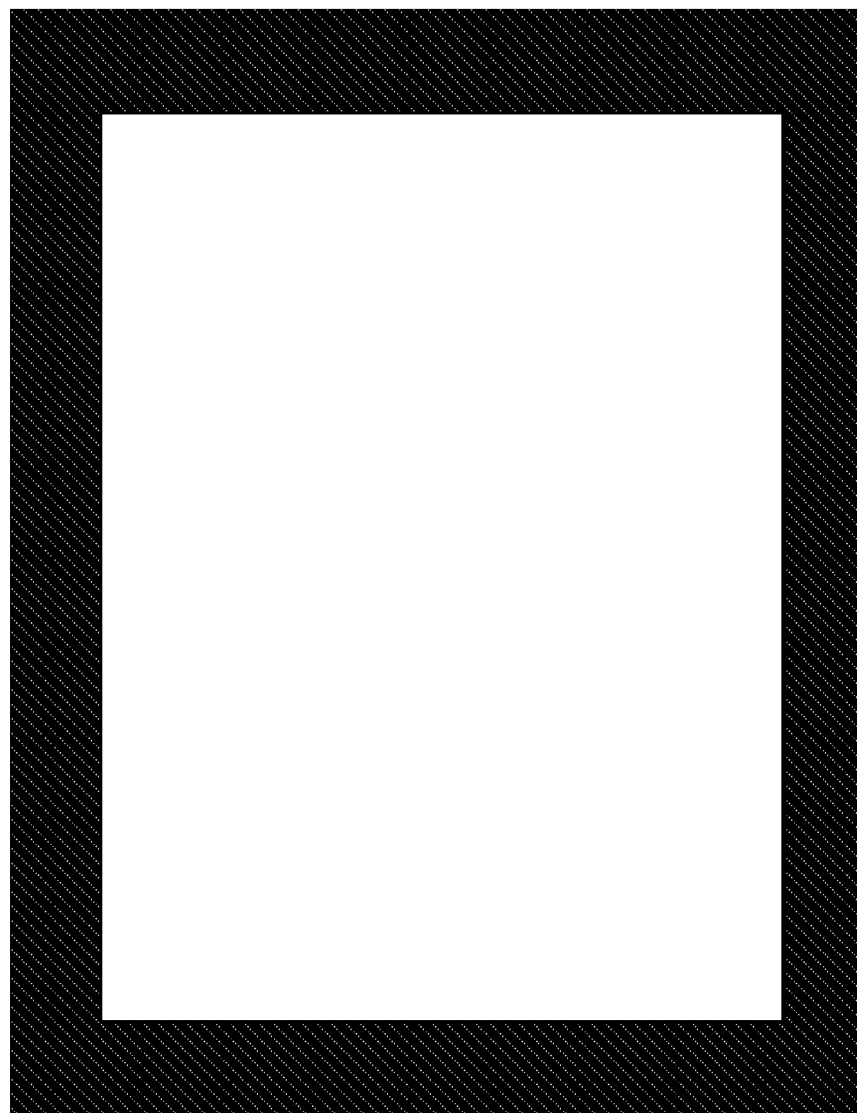
FIG. 1 is top view of a stiffener with a flat surface consistent with embodiments disclosed herein.

FIG. 1 shows a top view of a stiffener 100 with a flat surface 102. Under their own weight, a stack of stiffeners press against each other, leading to conformal surface contact (and can lead to a tight conformal surface contact). A small contaminant between stiffeners can be fully compressed, which can lead to two or more stiffeners sticking together. Double stiffener rejects are seen with the 100-300 um FM size.

For example, a stiffener of 100 nominal thickness can be 200-300 um with tight packing in a full tube (304 mm in height). A small thickness variation (e.g., 1-2 um) of stiffeners accumulates for hundreds of stacked stiffeners, which causes a tilt. A larger tilt leads to more pick-up issues with a pick and place tool. A topmost part in a full tube can have a 4 to 5 degree tilt, which is difficult for a pick and place machine to pick up.

Figure 2:
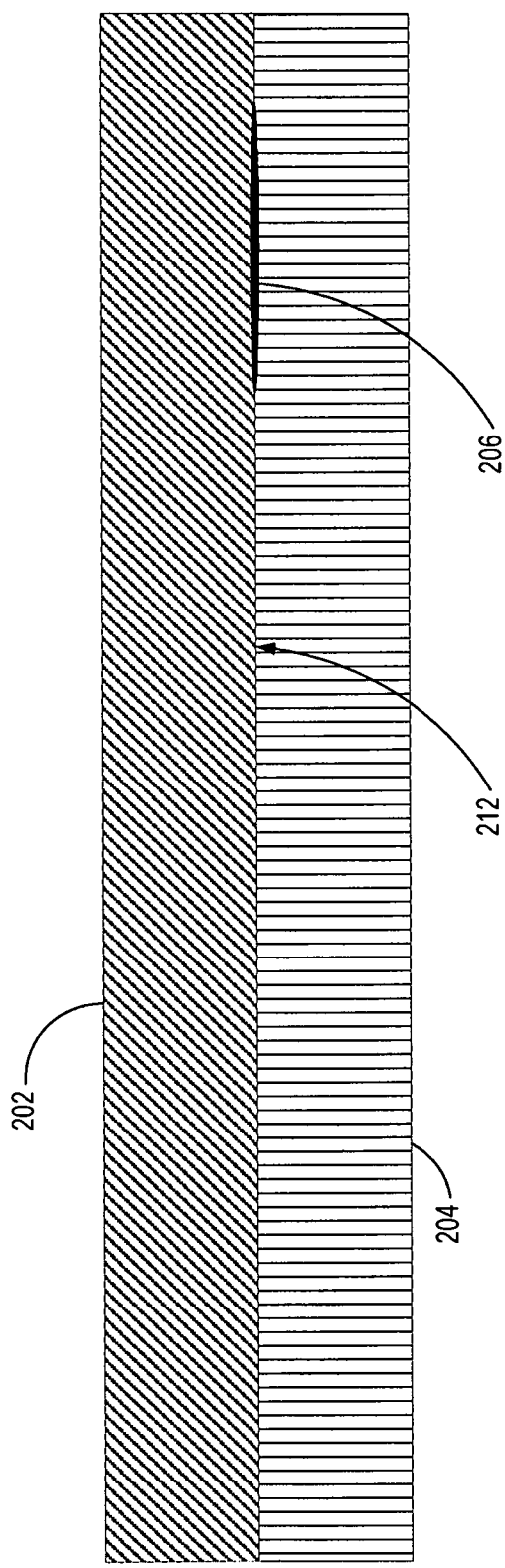
FIG. 2 is a side view of stacked stiffeners with a flat surface consistent with embodiments disclosed herein.

FIG. 2 shows a side view of stacked stiffeners 202 and 204 with a flat surface. A smooth flat surface leads to conformal surface contact between neighboring stiffeners 202 and 204 at their interface 212. Substantial conformal surface contact can lead to sticking of adjacent stiffeners 202 and 204. Further, even micron scale contaminant particles 206 are compressed and serve as sticking elements at the interface 212 between stiffeners 202 and 204. The micron scale contaminant particles 206 are compressed, which increases surface area contact with the stiffeners, and results in an increased adherence between stiffeners 202 and 204.

Figure 3:
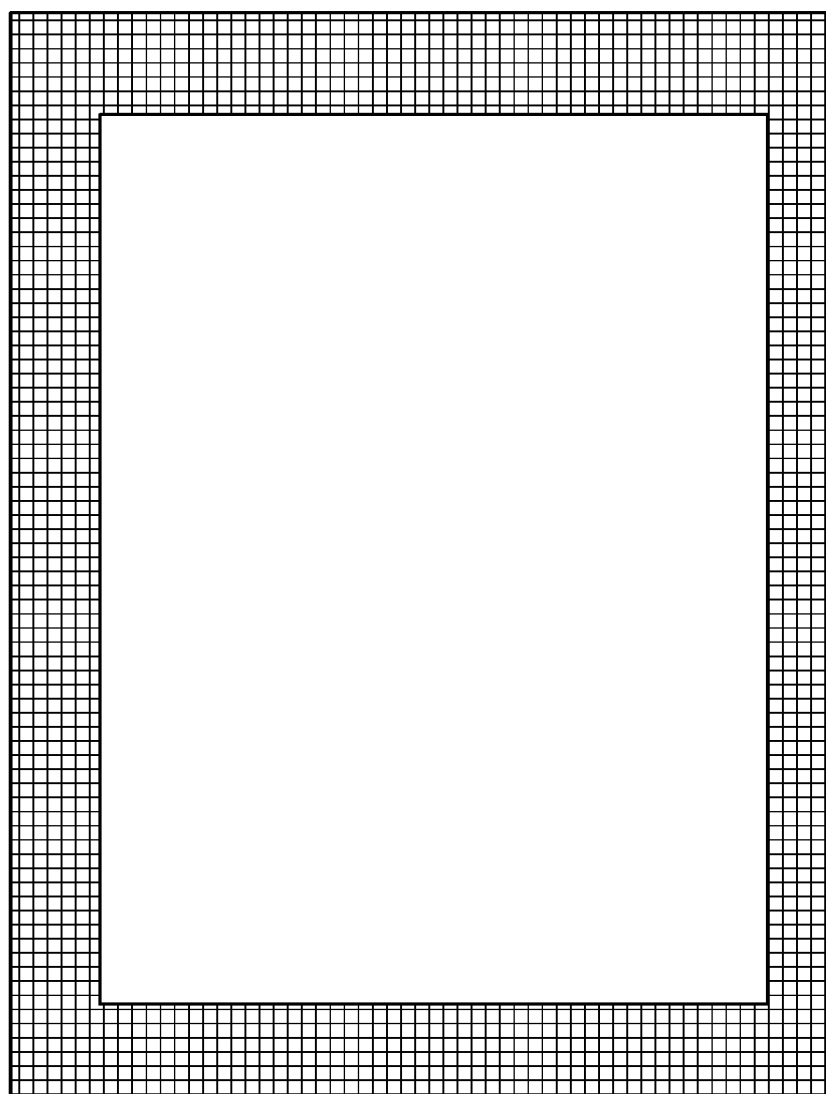
FIG. 3 a top view of a stiffener with a rough surface consistent with embodiments disclosed herein.

FIG. 3 shows a top view of a stiffener 300 with a rough surface 302. A stiffener 300 can reduce sticking and tilt by creating surface features, such as roughness. By creating surface features, conformal contact between stiffeners can be reduced. By creating surface features, a tilt in the raw material can be corrected by carving out, raising or manipulating surface features of the stiffener. A planar surface with surface features can create air gaps between top and bottom stiffeners. With air gaps, a micro-scale contaminant has less surface area in which to compress and become a sticking element.

These surface features can be added at a last step of progressive stamping or during each step of progressive stamping (which can be selected depending on an impact to stamping die life). In one embodiment, a progressive die can be used to induce different patterns. For example, patterns can be introduced in different directions to achieve increased surface roughness or uniformity without impacting manufacturing due to excessive material protrusion.

Figure 4:
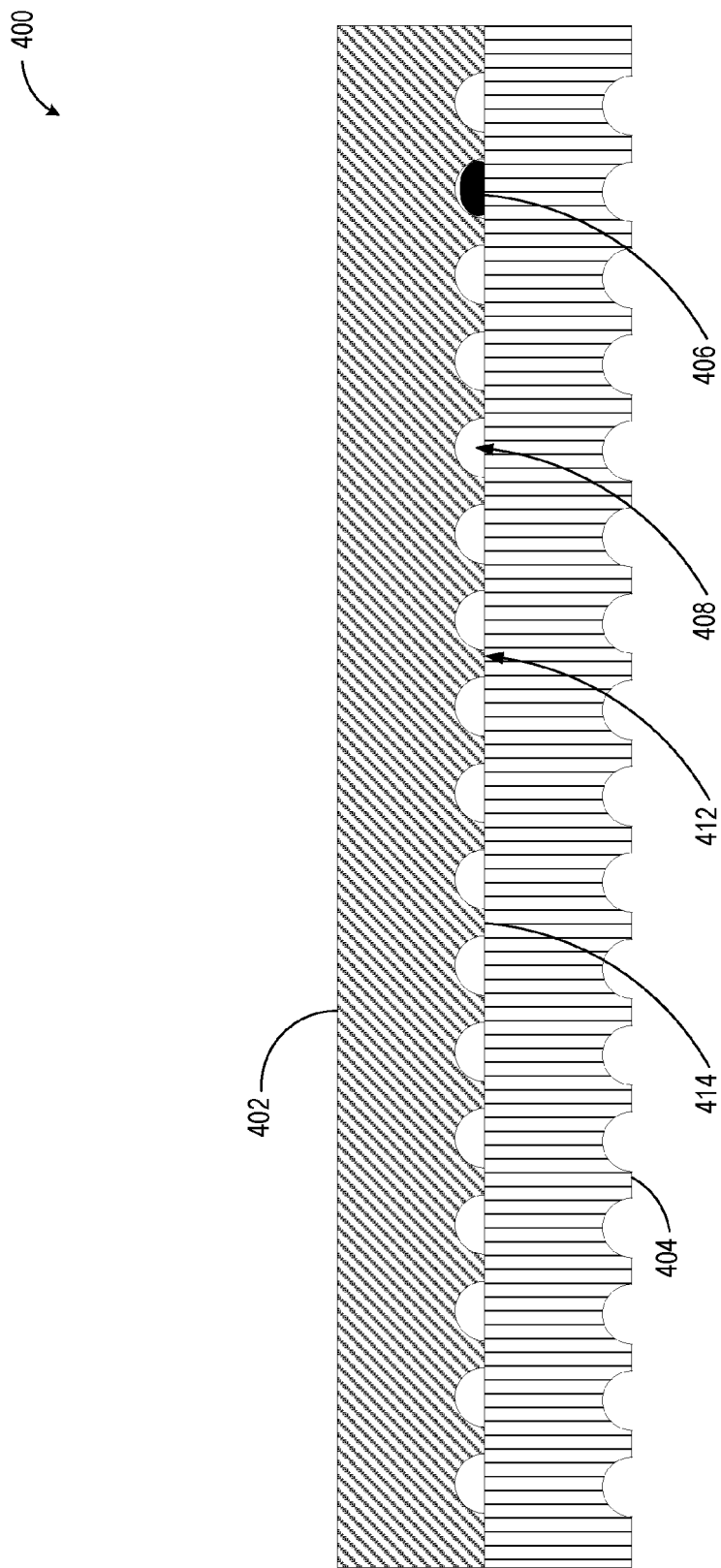
FIG. 4 is a side view of stacked stiffeners with surface features at the inter-stiffener interface consistent with embodiments disclosed herein.

FIG. 4 shows a side view of stacked stiffeners 402 and 404 with surface features 414 at the inter-stiffener interface 412. An increased surface roughness on a bottom side of a stiffener 402 and 404 can be created by modifying a stamping process to manufacture stiffeners. This surface can be an uneven surface, structured lines or patterns or other features placed in a random way, a partial pattern or an ordered pattern spread on a stiffener surface.

Surface features 414 create air gaps 408, reducing the conformal contact at an interface 412 between neighboring stiffeners 402 and 404. This can help prevent contamination particle 406 (such as those 100-300 um in size or others)

from creating sticking effects. The contamination particle 406 has less surface area in which it can be compressed and air gaps 408 in which it can reside, reducing compression of the contamination particle 406.

In some embodiments, a process of creating rough surface naturally reduces raw material thickness variation (such as by sanding, deformation, additive materials, etc.). This reduction in variation can reduce the final tilt. In some embodiments, adding roughness on a bottom side can enhance adhesion (such as when a primary mechanism is mechanical interlocking). By increasing adhesion level, sealant material can be reduced as well. In one embodiment, modifying a bottom surface of the stiffener does not impact a top surface finish where a specified top surface finish is expected for laser marking for unit level traceability.

Figure 5:
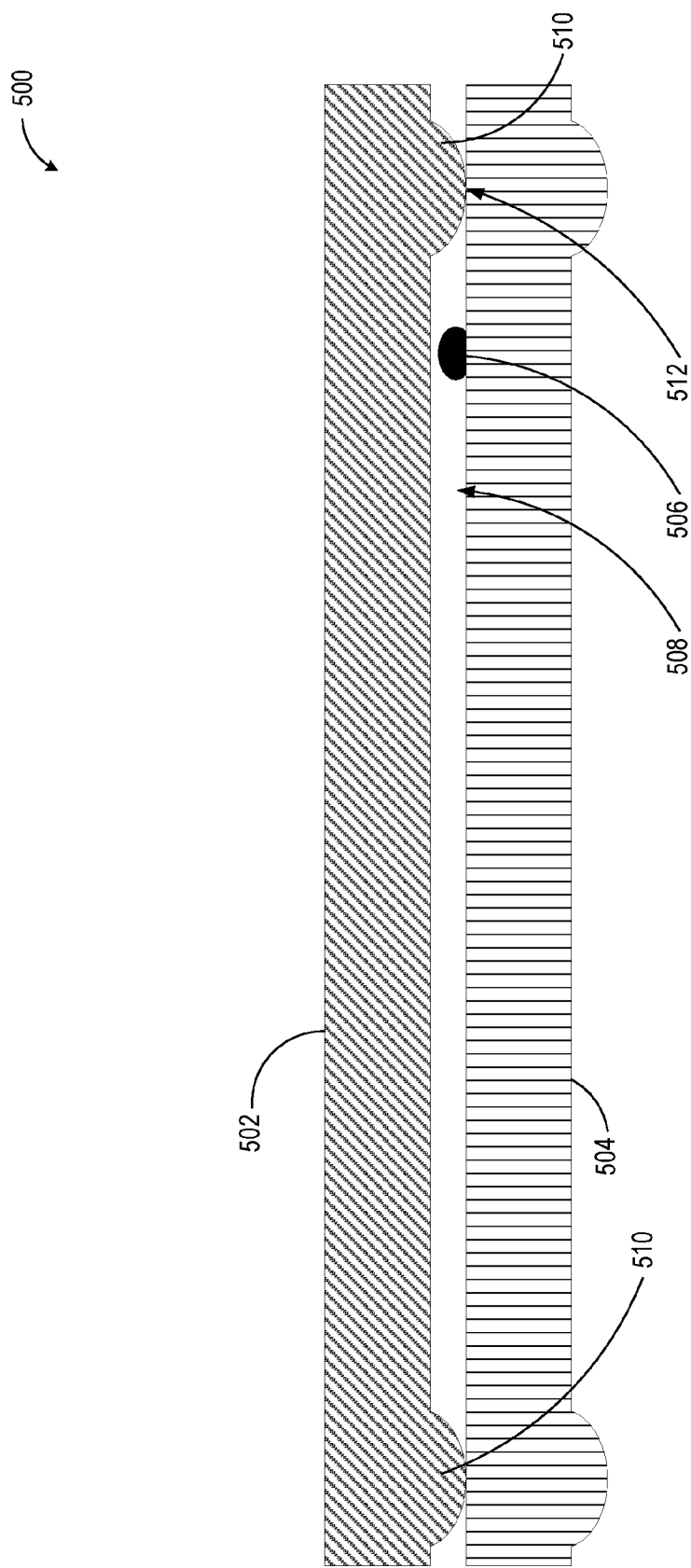
FIG. 5 is a side view of an alternate set of stacked stiffeners with surface features at the inter-stiffener interface consistent with embodiments disclosed herein.

FIG. 5 shows a side view of an alternate set of stacked stiffeners 502 and 504 with surface features 510 at the inter-stiffener interface 512. In the embodiment shown, surface features 510 as bumps have been added to stiffeners 502 and 504. The bumps provide an air gap 508 between stiffeners 502 and 504, which reduces conformal surface contact at the interface 512 and compression of contaminant 506. In addition, the embodiment shows that surface features 510 can be placed in only part of the surface of the stiffener 502 or 504, rather than across an entire surface. For example, the surface variations can be a roughened surface, a set of protrusions, or a set of ridges. The surface variations can be organized as a regular pattern, irregular, continuous across a surface or discontinuous (such as only in corners or along an edge).

Figure 6:
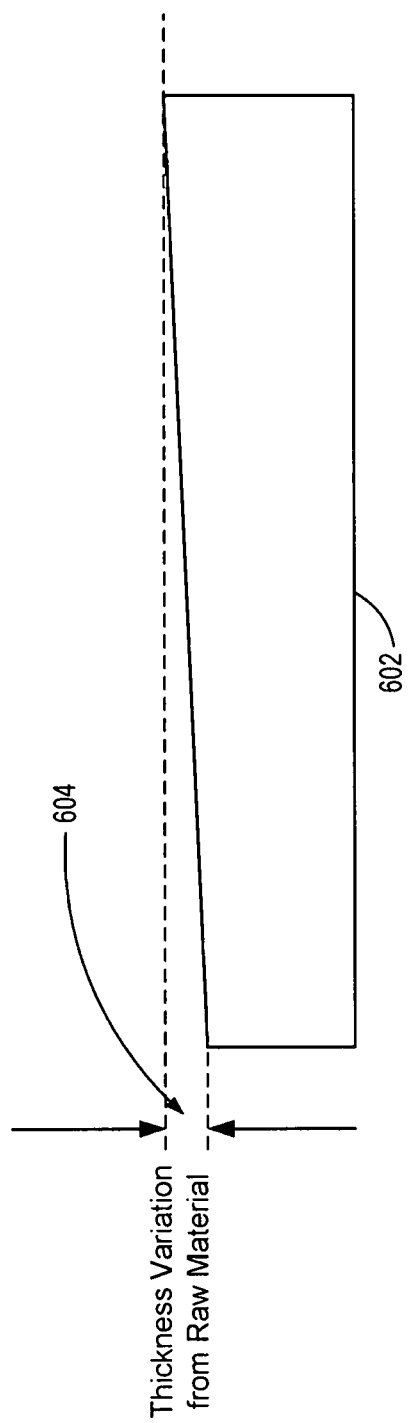
FIG. 6 is a stiffener with a thickness variation consistent with embodiments disclosed herein.

FIG. 6 shows a stiffener 602 with a thickness variation 604. Raw material thickness variations (2~3 um) accumulate as stiffeners are stacked together (such as within media). For example, a top stiffener can tilt with between 1 and 3 mm when about 1000 pieces form a stack. Such a tilt can cause pick-up issues with a pick and place tool.

Figure 7:
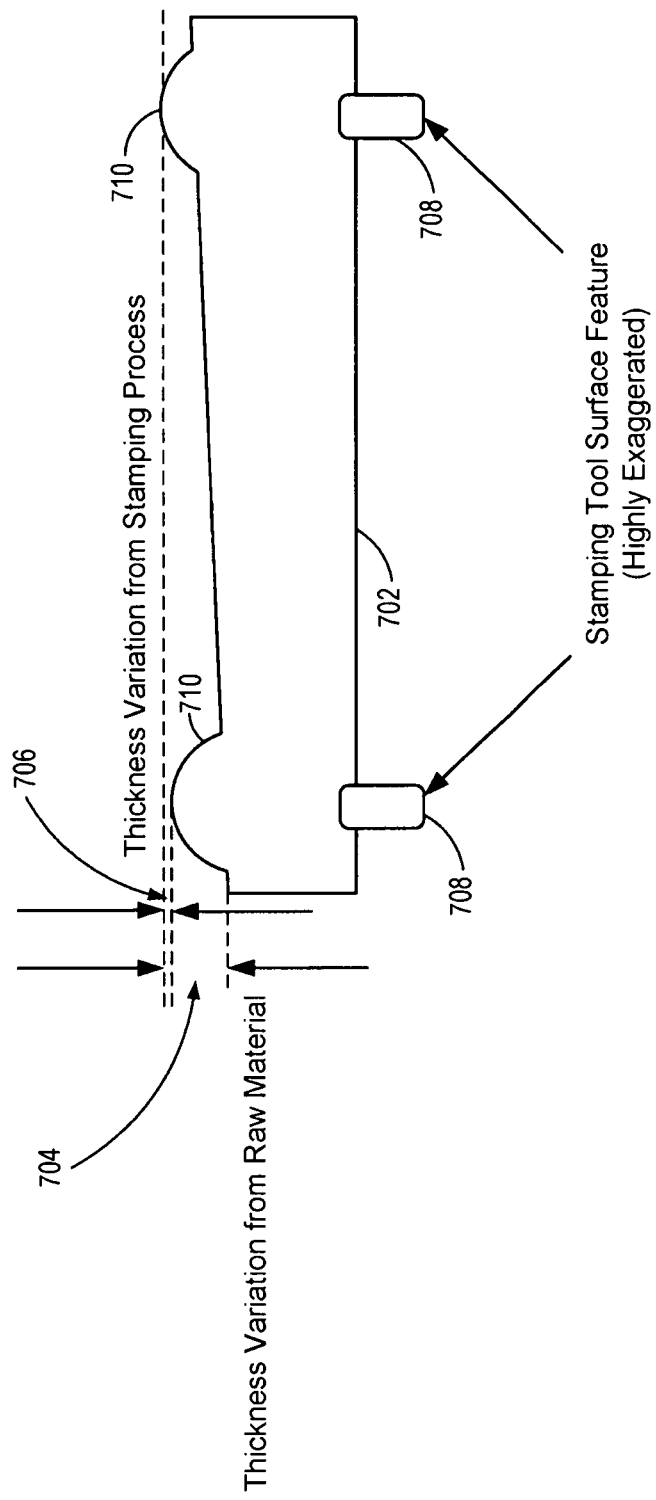
FIG. 7 is a stiffener with a raw material variation that is mitigated by creating surface variations consistent with embodiments disclosed herein.

FIG. 7 shows a stiffener 702 with a raw material variation 704 that is mitigated by creating surface variations 710. In the embodiment shown, a stamping process to create surface variations 710 can be used as a self-adjusting process to reduce top surface variation. For example, stamping using the stamping tool surface features 708 (which are exaggerated and not to scale for clarity) produces larger deformations in thin areas and smaller deformations in thicker areas to result in a smaller thickness variation 706. This stamping can result in a flatter top surface profile that reduces tilt as compared with the raw material variation 704.

Figure 8:
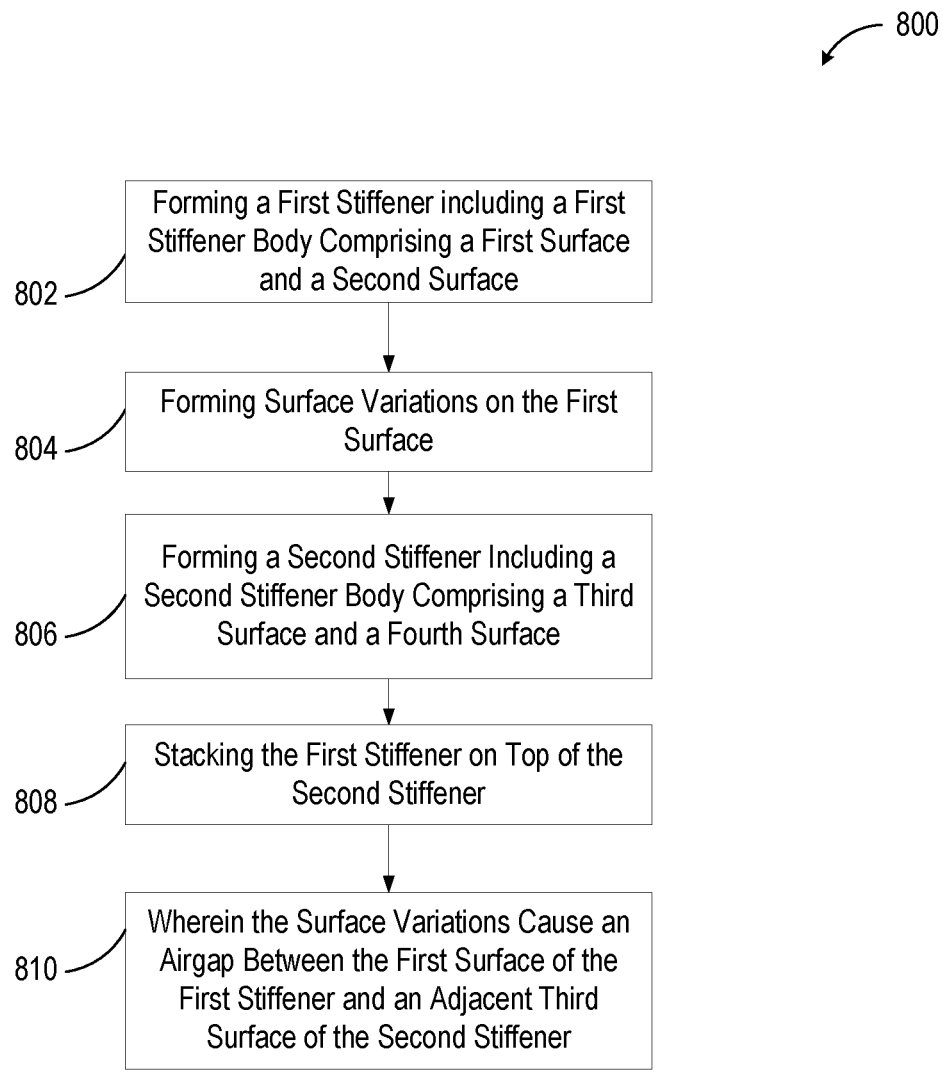
FIG. 8 is a flow chart illustrating a method for forming a set of stiffeners consistent with embodiments disclosed herein.

FIG. 8 shows a flow chart illustrating a method 800 for forming a set of stiffeners. The method can be performed by a set of stamping tools and/or surface modifying tools (such as a sander, welder, rotary tool, etching tool, laser, plasma etching, etc.). In box 802, the tool forms a first stiffener including a first stiffener body comprising a first surface and a second surface. In box 804, the tool forms surface variations on the first surface. In box 806, the tool forms a second stiffener, the forming comprising a third surface and a fourth surface. In box 808, the tool stacks the first stiffener on top of the second stiffener. In box 810, the surface variations are formed so as to cause an air gap between the first surface of the first stiffener and an adjacent third surface of the second stiffener.

Figure 9:
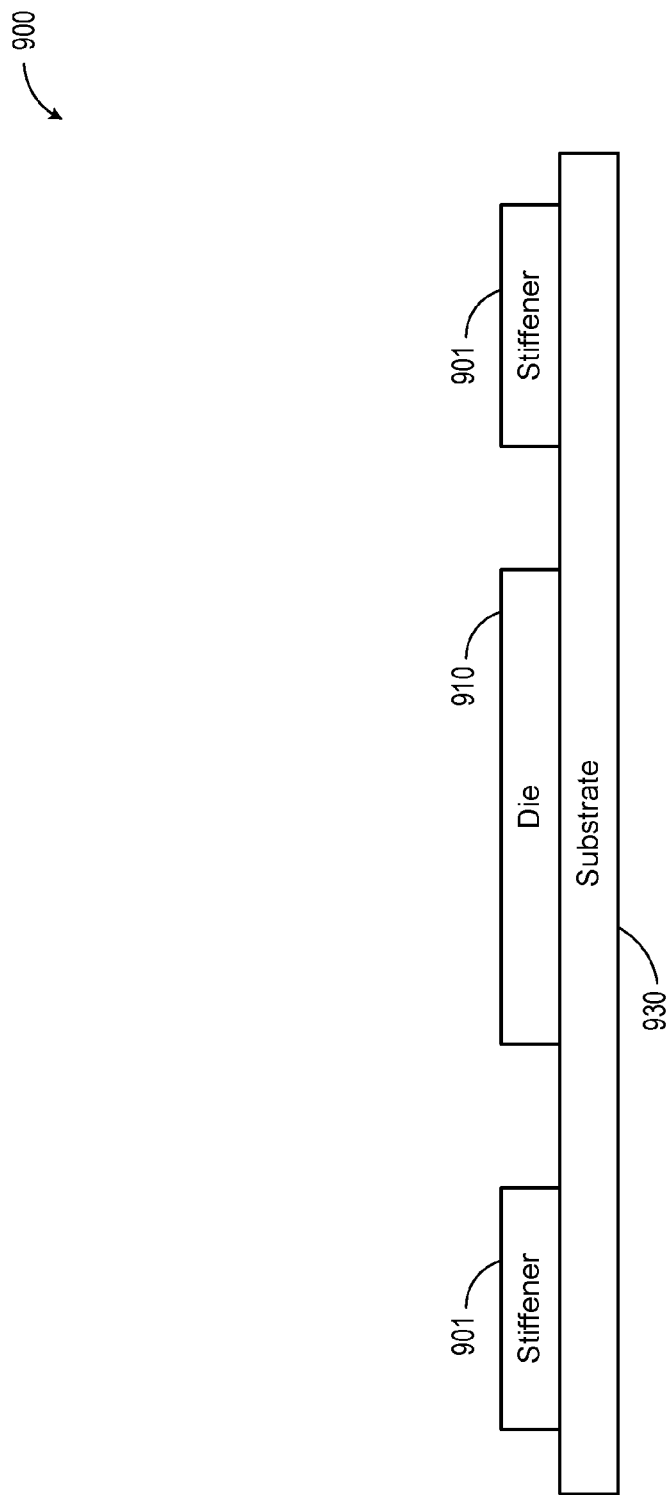
FIG. 9 is a portion of an electronic package consistent with embodiments disclosed herein.

FIG. 9 illustrates a portion of an electronic package 900. Package 900 includes a package substrate 930, a die 910, and metal stiffener 901. In the embodiment shown, a metal stiffener 901 comprises a body, such as a metal piece shaped in a rectangular or circular frame, that is glued to substrate 930. Metals such as copper or steel can be employed for stiffeners 901. Other non-metals such as plastics or polymers can also be used. The metal stiffener 901 has a cutout in the middle thereof to enable die 910 to pass through the frame of the metal stiffener 901. Substrate 930 can comprise a thin core or coreless substrate.

Substrate 930 can be handled by grasping metal stiffener 901 and without grasping substrate 930. The metal stiffener 901 provides mechanical stability to substrate 930 by reducing the forces applied to substrate 930 during handling of substrate 930.

Substrates can be fragile. For example, thin core and coreless substrates can be used. Such substrates can improve an electrical performance of a package by reducing lengths and distances of circuit paths and electrical connections. Substrates can be handled during an assembly and test manufacturing process. To enable a package to survive such handling and/or stresses in the use environment of the package, stiffeners are attached to substrates.

Stiffener 901 can be molded into various shapes and geometries in order to accommodate associated configurations of substrates, dies, and other package components. For example, a stiffener can be shaped like a frame or be L-shaped, linear shaped, etc. The stiffener can be shaped to partially or wholly surround the die. For example, two L-shaped stiffeners can be placed around a die, leaving a gap in between the stiffeners. In one embodiment, stiffener 901 may be attached to a package substrate, such as a thin core or coreless substrate. For instance, epoxy or another adhesive material may be employed to glue stiffener 901 to the substrate.

It should also be recognized that while a bottom surface has been described as receiving the surface variations, the top surface and/or both surfaces can receive same or different surface variations. In some embodiments, a top side can be constructed with surface variations, while a bottom surface is constructed to be smooth.

EXAMPLES

Example 1 is a pick and place tool medium. The pick and place tool medium includes a variety of stiffeners in a stack. The stiffeners are constructed to be mounted on a substrate in proximity of a perimeter of a die and provide support for the substrate. The stiffeners include a stiffener body consisting of a top surface and a bottom surface with surface variations. The surface variations cause an airgap between the bottom surface and an adjacent top surface which reduce conformal contact between the stiffeners.

Example 2 includes the pick and place tool medium of Example 1 and also includes a container around the stiffeners.

Example 3 includes the pick and place tool medium of Example 1, where the container is a tube.

Example 4 includes the pick and place tool medium of Example 1, where the surface variations average a raw material variation of stiffeners in a stack which avoid an accumulated tilt.

Example 5 includes the pick and place tool medium of Example 1, where the surface variations support the stiffener body to reduce compression of contaminant between the bottom and top surfaces.

Example 6 includes the pick and place tool medium of Example 5, where the contaminant causes sticking when compressed.

Example 7 includes the pick and place tool medium of Example 5, where the top surface includes additional surface variations.

Example 8 is an integrated (IC) package. The IC includes a die, a substrate supporting the die, and a package stiffener. The package stiffener is mounted at a perimeter of the substrate, and includes a textured surface coupled to the substrate. The textured surface has a greater surface area than a non-textured surface which provides additional surface for adhesion of the stiffener to the substrate.

Example 9 is an IC of Example 8, which includes an adhesive material between the stiffener and the substrate to adhere them together.

Example 10 is an IC of Example 8, which includes a sealant material between the stiffener and the substrate.

Example 11 is an IC of Example 10, where the package stiffener with the textured surface requires less sealant than an untextured package stiffener.

Example 12 is an IC of Example 8, where the textured surface causes an airgap between the textured surface and a top surface of an adjacent stiffener in a transport medium.

Example 13 is an IC of Example 8, where the die is a semiconductor device.

Example 14 is an IC of Example 13, where the semiconductor device is a processing unit.

Example 15 is an IC of Example 8, where the stiffener provides additional structural support for the substrate.

Example 16 is a stiffener. The stiffener includes a stiffener body designed to be mounted near the perimeter of a die on a substrate. The stiffener body includes a surface with variations which act[s] to avoid an accumulated tilt in the stack of stiffeners.

Example 17 is a stiffener of Example 16, where the surface variations cause an airgap between the first surface and an adjacent top surface of a stiffener in a transport medium.

Example 18 is a stiffener of Example 16, where the surface variations provide additional surface for adhesion of the stiffener to a substrate.

Example 19 is a stiffener of Example 16, where the stiffener body includes a second surface with surface variations.

Example 20 is a stiffener of Example 19, where the first surface is a bottom surface and the second surface is a top surface.

Example 21 is a stiffener of any of Examples 16-20, where the surface variations are a roughened surface.

Example 22 is a stiffener of any of Examples 16-20, where the surface variations are a set of protrusions.

Example 23 is a stiffener of any of Examples 16-20, where the surface variations are a set of ridges.

Example 24 is a stiffener of any of Examples 16-20, where the surface variations form a regular pattern on the stiffener body.

Example 25 is a stiffener of any of Examples 16-20, where the surface variations are irregular.

Example 26 is a stiffener of any of Examples 16-20, where the surface variations are continuous across the first surface.

Example 27 is a stiffener of any of Examples 16-20, where the surface variations are discontinuous across the first surface.

Example 28 is a stiffener of Example 27, where the surface variations are along an edge of the stiffener.

Example 29 is a stiffener of Example 27, where the surface variations are along one or more corners of the stiffener.

Example 30 is a stiffener of any of Examples 16-20, where the stiffener is formed from steel.

Example 31 is a stiffener of any of Examples 16-20, where the stiffener includes a void that enables it to surround the die when placed on a substrate.

Example 32 is a stiffener of any of Examples 16-20, where the stiffener partially surrounds the die.

Example 33 is a stiffener of Example 32, where the stiffener is L-shaped.

Example 34 is a method of forming a set of stiffeners. The method includes forming a first stiffener [body?], forming a second stiffener body, and stacking the first stiffener on top of the second stiffener. Forming the first stiffener body includes a first and a second surface which creates surface variations on the first surface. Forming the second stiffener [body?] includes a third and a fourth surface. Stacking the first stiffener with the surface variations on top of the second stiffener causes an airgap between the first surface of the first stiffener and the third surface of the second stiffener.

Example 35 is a method of Example 34, where the airgaps reduce conformal contact between the adjacent stiffeners.

Example 36 is a method of Example 34, where forming the first stiffener includes stamping.

Example 37 is a method of Example 36, where forming the first stiffener also includes progressive stamping.

Example 38 is a method of Example 37, where forming surface variations on the first surface also includes forming the surface variations during a final stamp of the progressive stamping.

Example 39 is the method of Example 34, where forming surface variations on the first surface includes plasma etching.

Example 40 is a pick and place tool medium. The pick and place tool medium includes a stacking means for holding stiffeners in a stack and variety of stiffeners within the stacking means. The stiffeners in the stack are mounted on a substrate near the perimeter of a die and provide support for the substrate. The variety of stiffeners in the stacking means include a stiffener body. The stiffener body includes a top surface and a bottom surface. The bottom surface includes an airgap for creating airgaps between the bottom and top surfaces which reduce conformal contact between the adjacent stiffeners.

Example 41 is a pick and place tool medium of Example 40, where the bottom surface also includes a variation means for averaging a raw material thickness of the stiffener body, avoiding an accumulated tilt of the stack of stiffeners.

A die can include one or more processors and/or memory. The processor may include a general purpose device, such as an Intel®, AMD®, or other "off-the-shelf" microprocessor. The processor may include a special purpose processing device, such as ASIC, SoC, SiP, FPGA, PAL, PLA, FPLA, PLD, or other customized or programmable device. The memory may include static RAM, dynamic RAM, flash memory, one or more flip-flops, ROM, or other computer storage medium.

Reference throughout this specification to "an example" means that a particular feature, structure, or characteristic described in connection with the example is included in at least one embodiment of the present invention. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of materials, frequencies, sizes, lengths, widths, shapes, etc., to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described in detail to avoid obscuring aspects of the invention.

It should be recognized that the systems or structures described herein include descriptions of specific embodiments. These embodiments can be combined into single systems or structures, partially combined into other systems or structures, split into multiple systems or structures or divided or combined in other ways. In addition, it is contemplated that parameters/attributes/aspects/etc. of one embodiment can be used in another embodiment. The parameters/attributes/aspects/etc. are merely described in one or more embodiments for clarity, and it is recognized that the parameters/attributes/aspects/etc. can be combined with or substituted for parameters/attributes/etc. of another embodiment unless specifically disclaimed herein.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

Those having skill in the art will appreciate that many changes may be made to the details of the above-described embodiments without departing from the underlying principles of the invention. The scope of the present invention should, therefore, be determined only by the following claims.

The invention claimed is:

1. A pick and place tool medium comprising:
a plurality of stiffeners in a stack, the stiffeners configured to be mounted on a substrate in proximity of a perimeter of a die and provide support for the substrate, the plurality of stiffeners comprising:
a stiffener body, comprising:
a top surface; and
a bottom surface comprising surface variations, the surface variations to cause an airgap between the bottom surface and an adjacent top surface of a stiffener in the pick and place tool media, the airgaps to reduce conformal contact between adjacent stiffeners.

2. The pick and place tool medium of claim 1, further comprising a container around the plurality of stiffeners.

3. The pick and place tool medium of claim 2, wherein the container is a tube.

4. The pick and place tool medium of claim 1, wherein the surface variations average a raw material variation of a stack of stiffeners, avoiding an accumulated tilt.

5. The pick and place tool medium of claim 1, wherein the surface variations support the stiffener body to reduce compression of contaminant between the bottom surface and the adjacent top surface.

6. The pick and place tool medium of claim 5, wherein the contaminant causes sticking when compressed.

7. The pick and place tool medium of claim 5, wherein the top surface further comprises additional surface variations.

8. An integrated (IC) package comprising:
a die;
a substrate supporting at least the die; and
a package stiffener mounted at a perimeter of the substrate, the stiffener comprising a textured surface facing and coupled to the substrate, the textured surface having a greater surface area than a non-textured surface, the textured surface to provide additional surface for adhesion of the stiffener to the substrate.

9. The IC of claim 8, wherein the textured surface causes an airgap between the textured surface and a top surface of an adjacent stiffener in a transport medium.

10. The IC of claim 8, wherein the die is a semiconductor device.

11. The IC of claim 10, wherein the semiconductor device is a processing unit.

12. The IC of claim 8, wherein the stiffener provides additional structural support for the substrate.

13. A stiffener, comprising:
a stiffener body configured to be mounted in proximity of a perimeter of a die on a substrate, the stiffener body comprising:
a first surface comprising surface variations, the surface variations to average raw material variation of a stack of more than two stiffeners, avoiding an accumulated tilt in the stack of stiffeners.

14. The stiffener of claim 13, wherein the surface variations cause an airgap between the first surface and an adjacent top surface of a stiffener in a transport medium.

15. The stiffener of claim 13, wherein the surface variations provide additional surface for adhesion of the stiffener to a substrate.

16. The stiffener of claim 13, wherein the stiffener body further comprises a second surface comprising surface variations.

17. The stiffener of claim 16, wherein the first surface is a bottom surface and the second surface is a top surface.

18. The stiffener of claim 13, wherein the surface variations are a roughened surface.

19. The stiffener of claim 13, wherein the surface variations are a set of protrusions.

20. The stiffener of claim 13, wherein the surface variations are irregular.

21. The stiffener of claim 13, wherein the surface variations are continuous across the first surface.

22. The stiffener of claim 13, wherein the surface variations are discontinuous across the first surface.

* * * * *